(12) United States Patent
Van Haren et al.

(10) Patent No.: US 11,300,888 B2
(45) Date of Patent: Apr. 12, 2022

(54) METHODS OF DETERMINING STRESS IN A SUBSTRATE, CONTROL SYSTEM FOR CONTROLLING A LITHOGRAPHIC PROCESS, LITHOGRAPHIC APPARATUS AND COMPUTER PROGRAM PRODUCT

(71) Applicant: ASML NETHERLANDS B.V., Veldhoven (NL)

(72) Inventors: Richard Johannes Franciscus Van Haren, Waalre (NL); Leon Paul Van Dijk, Eindhoven (NL); Ilya Malakhovsky, Eindhoven (NL); Ronald Henricus Johannes Otten, Rosmalen (NL)

(73) Assignee: ASML Netherlands B.V., Veldhoven (NL)

( * ) Notice: Subject to any disclaimer, the term of this patent is extended or adjusted under 35 U.S.C. 154(b) by 8 days.

(21) Appl. No.: 16/485,499

(22) PCT Filed: Feb. 7, 2018

(86) PCT No.: PCT/EP2018/053013
§ 371 (c)(1),
(2) Date: Aug. 13, 2019

(87) PCT Pub. No.: WO2018/166717
PCT Pub. Date: Sep. 20, 2018

(65) Prior Publication Data
US 2020/0050117 A1    Feb. 13, 2020

(30) Foreign Application Priority Data

Mar. 14, 2017  (EP) .................................... 17160800

(51) Int. Cl.
*G03F 7/20*    (2006.01)
*G03F 9/00*    (2006.01)

(52) U.S. Cl.
CPC ...... *G03F 7/70783* (2013.01); *G03F 7/70525* (2013.01); *G03F 7/70625* (2013.01); *G03F 9/7003* (2013.01)

(58) Field of Classification Search
CPC .. G03F 7/70783; G03F 7/70516; G03F 7/705; G03F 7/70633; G03F 7/70133;
(Continued)

(56) References Cited

U.S. PATENT DOCUMENTS

| 5,329,126 A | 7/1994 | Amemiya et al. |
| 2006/0049480 A1* | 3/2006 | Naka ................. G01N 21/9501 257/521 |

(Continued)

FOREIGN PATENT DOCUMENTS

| CN | 101852983 | 10/2010 |
| CN | 105334706 | 2/2016 |

(Continued)

OTHER PUBLICATIONS

International Search Report and Written Opinion issued in corresponding PCT Patent Application No. PCT/EP2018/053013, dated May 24, 2018.

(Continued)

*Primary Examiner* — Mesfin T Asfaw
(74) *Attorney, Agent, or Firm* — Pillsbury Winthrop Shaw Pittman LLP

(57) ABSTRACT

A method and control system for determining stress in a substrate. The method includes determining a measured position difference between a measured position of at least one first feature and a measured position of at least one second feature which have been applied on a substrate, and determining local stress in the substrate from the measured position difference.

20 Claims, 2 Drawing Sheets

(58) Field of Classification Search
CPC .. G03F 9/7046; G03F 9/7092; G03F 7/70258; G03F 9/7084; G03F 7/7085; G03F 9/7026; G03F 7/70141; G03F 7/70641; G03F 7/70616; G03F 7/7065; G03F 7/70775; G03F 7/70625; G03F 9/7003; G03F 7/70983; G03F 7/20; G03F 7/70358; G03F 9/7019; G03F 7/70433; G03F 7/709; G03F 9/7088; G03F 7/70508; G03F 7/706; G03F 7/70666; G03F 9/7076; G03F 7/70725; G03F 7/70525; G03B 27/32; G03B 27/68; G06F 30/398
See application file for complete search history.

(56) References Cited

U.S. PATENT DOCUMENTS

| | | | |
|---|---|---|---|
| 2007/0258637 A1* | 11/2007 | Yang | G03F 7/70633 382/151 |
| 2012/0208301 A1 | 8/2012 | Izikson et al. | |
| 2013/0188160 A1 | 7/2013 | Ruoff et al. | |

FOREIGN PATENT DOCUMENTS

| | | |
|---|---|---|
| JP | H04293225 | 10/1992 |
| JP | H08195335 | 7/1996 |
| JP | 2010122526 | 6/2010 |
| TW | 200517772 | 6/2005 |
| TW | 200736822 | 10/2007 |

OTHER PUBLICATIONS

Taiwanese Office Action issued in corresponding Taiwanese Patent Application No. 107107518, dated Sep. 12, 2018.
Turner, Kevin, et al.: "Predicting distortions and overlay errors due to wafer deformation during chucking on lithography scanners", Journal of Micro/Nanolithography, MEMS MOEMS, vol. 8, No. 4, Oct. 1, 2009.
Mallik, Aditi, et al.: "Finite-Element Simulation of Different Kinds of Wafer Warpages: Spherical, Cylindrical, and Saddle", IEEE Transactions on Components, Packaging and Manufacturing Technology, vol. 4, No. 2, Feb. 1, 2014.
Brunner, Timothy A., et al.: "Characterization of wafer geometry and overlay error on silicon wafers with nonuniform stress", Journal of Micro/Nanolithograpny, MEMS MOEMS, vol. 12, No. 4, Oct. 1, 2013.
Korean Office Action issued in corresponding Korean Patent Application No. 10-2019-7029965, dated Mar. 16, 2021.

* cited by examiner

METHODS OF DETERMINING STRESS IN A SUBSTRATE, CONTROL SYSTEM FOR CONTROLLING A LITHOGRAPHIC PROCESS, LITHOGRAPHIC APPARATUS AND COMPUTER PROGRAM PRODUCT

CROSS-REFERENCE TO RELATED APPLICATIONS

This application is the U.S. national phase entry of PCT Patent Application No. PCT/EP2018/053013, filed on Feb. 7, 2018, which claims the benefit of European patent application no. 17160800.3, which was filed on Mar. 14, 2017 and which is incorporated herein in its entirety by reference.

BACKGROUND

Field of the Invention

The present invention relates to control apparatus and control methods usable, for example, to maintain performance in the manufacture of devices by patterning processes such as lithography. The invention further relates to methods of manufacturing devices using lithographic techniques. The invention yet further relates to computer program products for use in implementing such methods.

Related Art

A lithographic process is one in which a lithographic apparatus applies a desired pattern onto a substrate, usually onto a target portion of the substrate, after which various processing chemical and/or physical processing steps work through the pattern to create functional features of a complex product. The accurate placement of patterns on the substrate is a chief challenge for reducing the size of circuit components and other products that may be produced by lithography. In particular, the challenge of measuring accurately the features on a substrate which have already been laid down is a critical step in being able to position successive layers of features in superposition accurately enough to produce working devices with a high yield. So-called overlay should, in general, be achieved within a few tens of nanometers in today's sub-micron semiconductor devices, down to a few nanometers in the most critical layers.

Consequently, modern lithography apparatuses involve extensive measurement or 'mapping' operations prior to the step of actually exposing or otherwise patterning the substrate at a target location. So-called advanced alignment models have been and continue to be developed to model and correct more accurately non-linear distortions of the wafer 'grid' that are caused by processing steps and/or by the lithographic apparatus itself.

Stress and in-line distortions of the substrate can, in some cases, be determined via measurements of the shape (e.g., slope) of an unclamped substrate. However, this is not always possible, e.g., where the processing results in a flat substrate.

SUMMARY OF THE INVENTION

The present invention aims to improve systems for control of performance in parameters such as overlay in lithographic processes.

More specifically, the present invention aims to improve measurement of stress in a substrate.

According to a first aspect of the present invention, there is provided a method of determining stress in a substrate, comprising: determining a measured position difference between a measured position of at least one first feature and a measured position of at least one second feature which have been applied on a substrate, wherein said first feature and said second feature are located within a single exposure image field of a lithographic apparatus used to measure said measured positions; and determining local stress in the substrate from said measured position difference.

According to a second aspect of the present invention, there is provided a control system for controlling a lithographic process, the control system comprising: storage for receiving metrology data comprising a plurality of measured position differences from a plurality of feature pairs, each feature pair being located at a different location on a substrate, and comprising a first feature and a second feature; and a processor operable to: determine a local stress in the substrate from each of the measured position differences; determine a stress fingerprint describing stress variation over the substrate, based on the measured position differences; determine in-plane distortion of said substrate from the stress fingerprint; and determine corrections for performing a subsequent patterning step on the substrate using the determined in-plane distortion The invention yet further provides a lithographic apparatus including a control system according to the second aspect of the invention as set forth above.

The invention yet further provides a computer program product containing one or more sequences of machine-readable instructions for implementing calculating steps in a method according to the first aspect of the invention as set forth above.

These and other aspects and advantages of the apparatus and methods disclosed herein will be appreciated from a consideration of the following description and drawings of exemplary embodiments.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF EXEMPLARY EMBODIMENTS

Before describing embodiments of the invention in detail, it is instructive to present an example environment in which embodiments of the present invention may be implemented.

Figure 1:
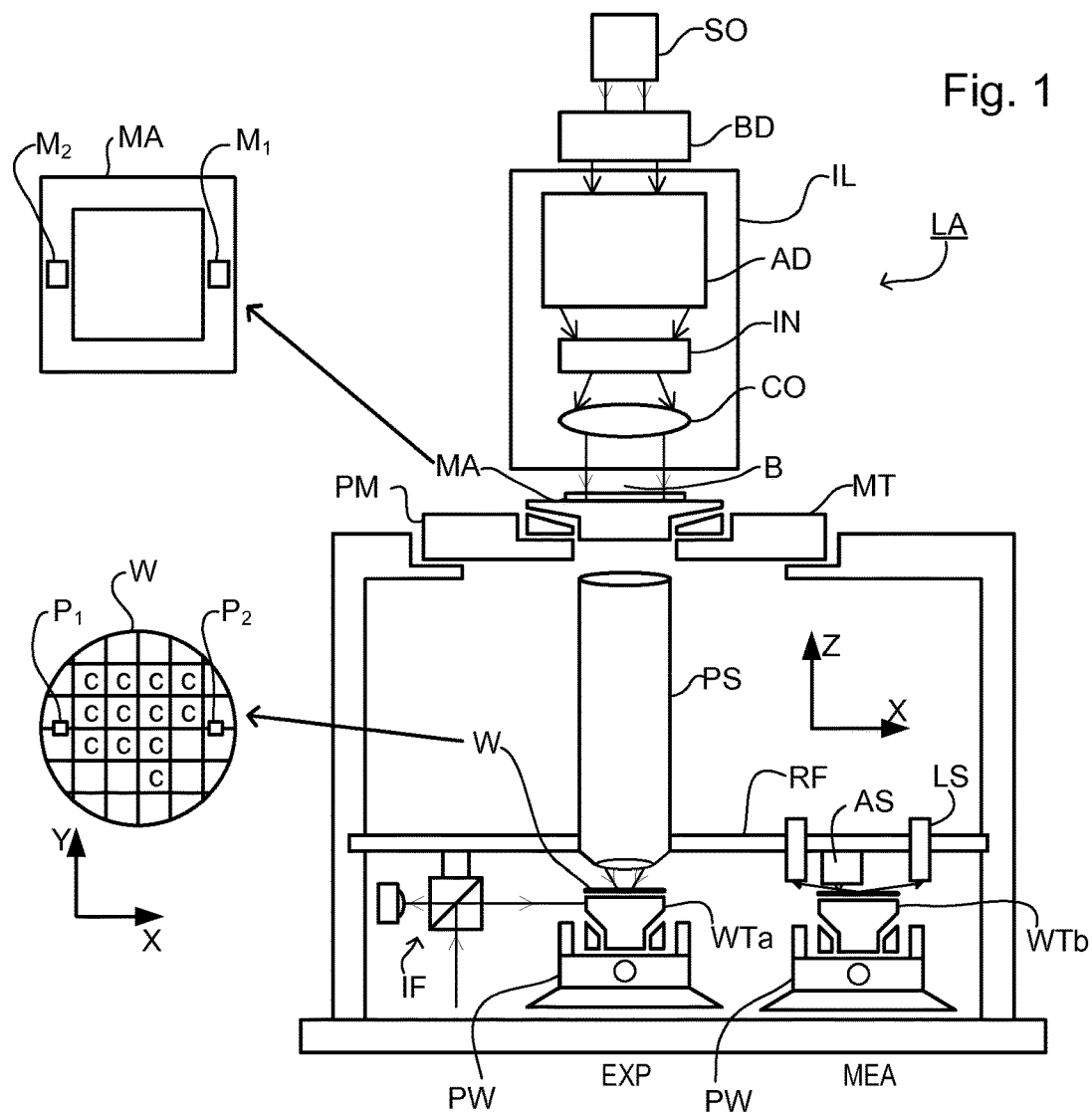
FIG. 1 depicts a lithographic apparatus suitable for use in an embodiment of the present invention.

FIG. 1 schematically depicts a lithographic apparatus LA. The apparatus includes an illumination system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; two substrate tables (e.g., a wafer table) WTa and WTb each constructed to hold a substrate (e.g., a resist coated wafer) W and each connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., including one or more dies) of the substrate W. A reference frame RF connects the various components, and serves as a reference for setting and measuring positions of the patterning device and substrate and of features on them.

The illumination system may include various types of optical components, such as refractive, reflective, magnetic, electromagnetic, electrostatic or other types of optical components, or any combination thereof, for directing, shaping, or controlling radiation. For example, in an apparatus using extreme ultraviolet (EUV) radiation, reflective optical components will normally be used.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support MT may be a frame or a table, for example, which may be fixed or movable as required. The patterning device support may ensure that the patterning device is at a desired position, for example with respect to the projection system.

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

As here depicted, the apparatus is of a transmissive type (e.g., employing a transmissive patterning device). Alternatively, the apparatus may be of a reflective type (e.g., employing a programmable mirror array of a type as referred to above, or employing a reflective mask). Examples of patterning devices include masks, programmable mirror arrays, and programmable LCD panels. Any use of the terms "reticle" or "mask" herein may be considered synonymous with the more general term "patterning device." The term "patterning device" can also be interpreted as referring to a device storing in digital form pattern information for use in controlling such a programmable patterning device.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems.

In operation, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may for example include an adjuster AD for adjusting the angular intensity distribution of the radiation beam, an integrator IN and a condenser CO. The illuminator may be used to condition the radiation beam, to have a desired uniformity and intensity distribution in its cross section.

The radiation beam B is incident on the patterning device MA, which is held on the patterning device support MT, and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WTa or WTb can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment marks may also be included within dies, in amongst the device features, in which case it is desirable that the markers be as small as possible and not require any different imaging or process conditions than adjacent features. The alignment system, which detects the alignment markers, is described further below.

The depicted apparatus could be used in a variety of modes. In a scan mode, the patterning device support (e.g., mask table) MT and the substrate table WT are scanned synchronously while a pattern imparted to the radiation beam is projected onto a target portion C (i.e., a single dynamic exposure). The speed and direction of the substrate table WT relative to the patterning device support (e.g., mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion. Other types of lithographic apparatus and modes of operation are possible, as is well-known in the art. For example, a step mode is known. In so-called "maskless" lithography, a programmable patterning device is held stationary but with a changing pattern, and the substrate table WT is moved or scanned.

Combinations and/or variations on the above described modes of use or entirely different modes of use may also be employed.

Lithographic apparatus LA is of a so-called dual stage type which has two substrate tables WTa, WTb and two stations—an exposure station EXP and a measurement station MEA—between which the substrate tables can be exchanged. While one substrate on one substrate table is being exposed at the exposure station, another substrate can be loaded onto the other substrate table at the measurement station and various preparatory steps carried out. This enables a substantial increase in the throughput of the apparatus. On a single stage apparatus, the preparatory steps and exposure steps need to be performed sequentially on the single stage, for each substrate. The preparatory steps may include mapping the surface height contours of the substrate using a level sensor LS and measuring the position of alignment markers on the substrate using an alignment sensor AS. If the position sensor IF is not capable of measuring the position of the substrate table while it is at the measurement station as well as at the exposure station, a second position sensor may be provided to enable the positions of the substrate table to be tracked at both stations, relative to reference frame RF. Other arrangements are known and usable instead of the dual-stage arrangement shown. For example, other lithographic apparatuses are known in which a substrate table and a measurement table are provided. These are docked together when performing preparatory measurements, and then undocked while the substrate table undergoes exposure.

Figure 2:
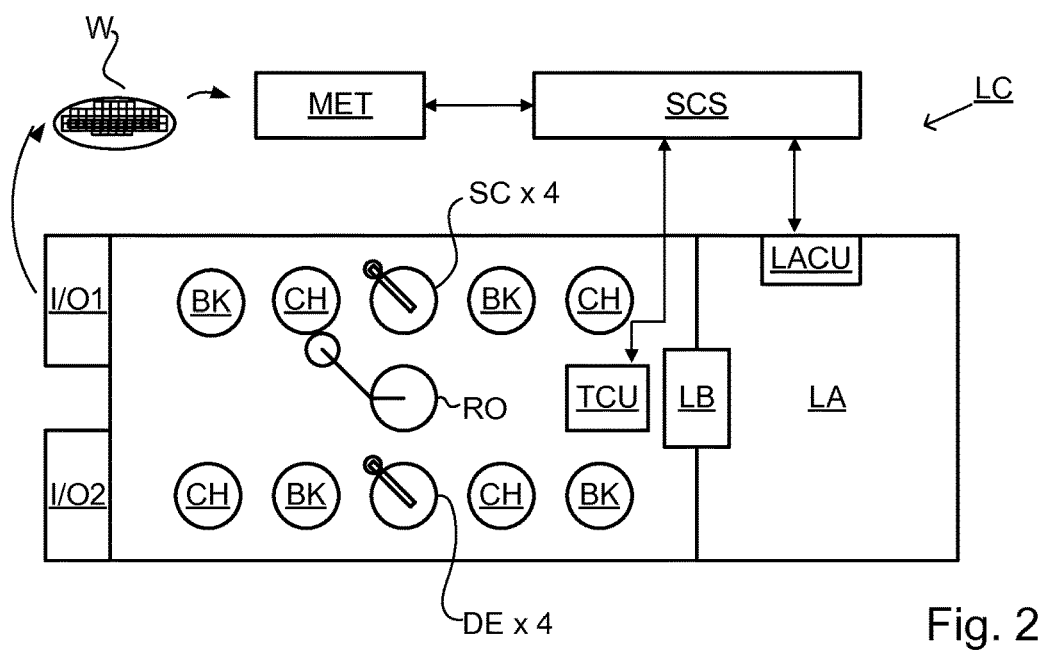
FIG. 2 depicts a lithographic cell or cluster in which an inspection apparatus according to the present invention may be used.

As shown in FIG. 2, the lithographic apparatus LA forms part of a lithographic cell LC, also sometimes referred to a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. Accordingly a manufacturing facility in which lithocell LC is located also includes metrology system MET which receives some or all of the substrates W that have been processed in the lithocell. Metrology results are provided directly or indirectly to the supervisory control system SCS. If errors are detected, adjustments may be made to exposures of subsequent substrates.

Within metrology system MET, an inspection apparatus is used to determine the properties of the substrates, and in particular, how the properties of different substrates or different layers of the same substrate vary from layer to layer. The inspection apparatus may be integrated into the lithographic apparatus LA or the lithocell LC or may be a stand-alone device. To enable most rapid measurements, it may be desirable that the inspection apparatus measure properties in the exposed resist layer immediately after the exposure. However, not all inspection apparatus have sufficient sensitivity to make useful measurements of the latent image. Therefore measurements may be taken after the post-exposure bake step (PEB) which is customarily the first step carried out on exposed substrates and increases the contrast between exposed and unexposed parts of the resist. At this stage, the image in the resist may be referred to as semi-latent. It is also possible to make measurements of the developed resist image—at which point either the exposed or unexposed parts of the resist have been removed. Also, already exposed substrates may be stripped and reworked to improve yield, or discarded, thereby avoiding performing further processing on substrates that are known to be faulty. In a case where only some target portions of a substrate are faulty, further exposures can be performed only on those target portions which are good.

The metrology step with metrology system MET can also be done after the resist pattern has been etched into a product layer. The latter possibility limits the possibilities for rework of faulty substrates but may provide additional information about the performance of the manufacturing process as a whole.

Figure 3:
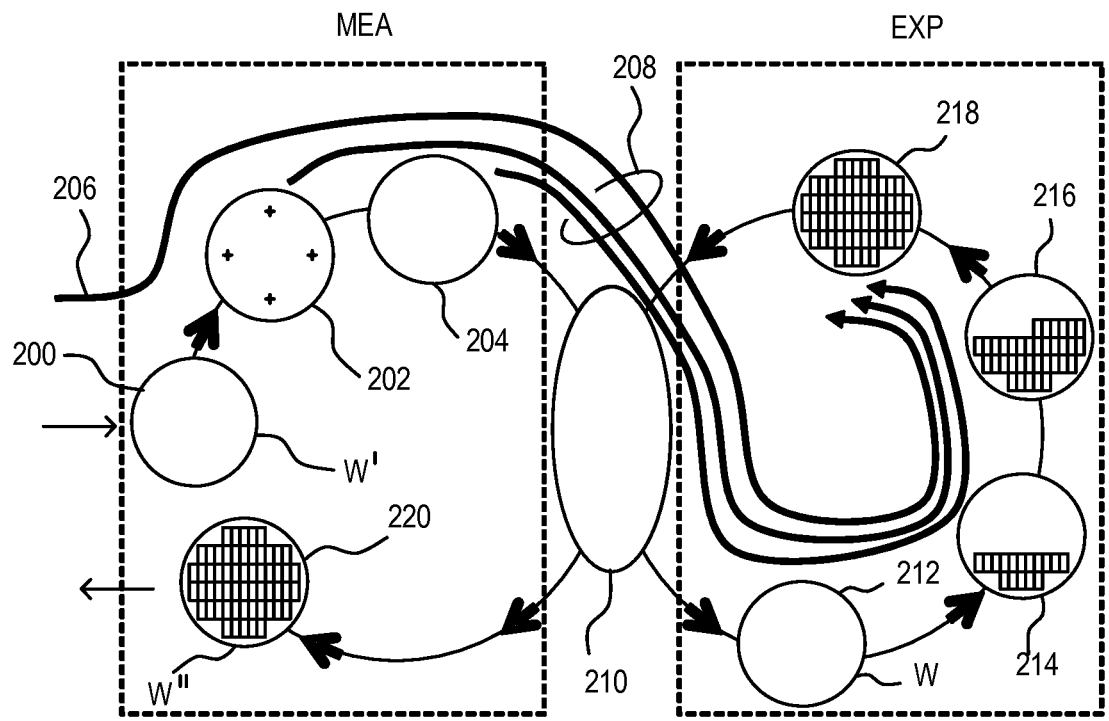
FIG. 3 illustrates schematically measurement and exposure processes in the apparatus of FIG. 1, according to known practice.

FIG. 3 illustrates the steps to expose target portions (e.g. dies) on a substrate W in the dual stage apparatus of FIG. 1. The process according to conventional practice will be described first. The present disclosure is by no means limited to dual stage apparatus of the illustrated type. The skilled person will recognize that similar operations are performed in other types of lithographic apparatus, for example those having a single substrate stage and a docking metrology stage.

On the left hand side within a dotted box are steps performed at measurement station MEA, while the right hand side shows steps performed at exposure station EXP. From time to time, one of the substrate tables WTa, WTb will be at the exposure station, while the other is at the measurement station, as described above. For the purposes of this description, it is assumed that a substrate W has already been loaded into the exposure station. At step 200, a new substrate W' is loaded to the apparatus by a mechanism not shown. These two substrates are processed in parallel in order to increase the throughput of the lithographic apparatus.

Referring initially to the newly-loaded substrate W', this may be a previously unprocessed substrate, prepared with a new photo resist for first time exposure in the apparatus. In general, however, the lithography process described will be merely one step in a series of exposure and processing steps, so that substrate W' has been through this apparatus and/or other lithography apparatuses, several times already, and may have subsequent processes to undergo as well. Particularly for the problem of improving overlay performance, the task is to ensure that new patterns are applied in exactly the correct position on a substrate that has already been subjected to one or more cycles of patterning and processing. Each patterning step can introduce positional deviations in the applied pattern, while subsequent processing steps progressively introduce distortions in the substrate and/or the pattern applied to it that must be measured and corrected for, to achieve satisfactory overlay performance.

The previous and/or subsequent patterning step may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation. Some layers may be patterned by steps that are alternative or supplementary to exposure in the illustrated lithographic apparatus. Such alternative and supplementary techniques include for example imprint lithography, self-aligned multiple patterning and directed self-assembly. Similarly, other processing steps performed per layer (e.g., CMP and etch) may be performed on different apparatuses per layer.

At 202, alignment measurements using the substrate marks P1 etc. and image sensors (not shown) are used to measure and record alignment of the substrate relative to substrate table WTa/WTb. In addition, several alignment marks across the substrate W' will be measured using alignment sensor AS. These measurements are used in one embodiment to establish a substrate model (sometimes referred to as the "wafer grid"), which maps very accurately the distribution of marks across the substrate, including any distortion relative to a nominal rectangular grid.

At step 204, a map of wafer height (Z) against X-Y position is measured also using the level sensor LS. Primarily, the height map is used only to achieve accurate focusing of the exposed pattern. It may be used for other purposes in addition.

When substrate W' was loaded, recipe data 206 were received, defining the exposures to be performed, and also properties of the wafer and the patterns previously made and to be made upon it. Where there is a choice of alignment marks on the substrate, and where there is a choice of settings of an alignment sensor, these choices are defined in an alignment recipe among the recipe data 206. The alignment recipe therefore defines how positions of alignment marks are to be measured, as well as which marks.

At 210, wafers W' and W are swapped, so that the measured substrate W' becomes the substrate W entering the exposure station EXP. In the example apparatus of FIG. 1, this swapping is performed by exchanging the supports WTa and WTb within the apparatus, so that the substrates W, W' remain accurately clamped and positioned on those supports, to preserve relative alignment between the substrate tables and substrates themselves. Accordingly, once the tables have been swapped, determining the relative position between projection system PS and substrate table WTb (formerly WTa) is all that is necessary to make use of the measurement information 202, 204 for the substrate W (formerly W') in control of the exposure steps. At step 212, reticle alignment is performed using the mask alignment marks M1, M2. In steps 214, 216, 218, scanning motions and radiation pulses are applied at successive target locations across the substrate W, in order to complete the exposure of a number of patterns.

By using the alignment data and height map obtained at the measuring station in the performance of the exposure steps, these patterns are accurately aligned with respect to the desired locations, and, in particular, with respect to features previously laid down on the same substrate. The exposed substrate, now labeled W" is unloaded from the apparatus at step 220, to undergo etching or other processes, in accordance with the exposed pattern.

Substrate distortion may impact overlay performance in a lithographic process. Substrate distortion may result from a thermal treatment of the substrate (e.g. laser anneal) or deposition of stressed thin films. The free-form substrate shape, which can be measured with off-line metrology tools, may change as a result of this distortion. Typical shapes which may be observed in high volume manufacturing are bowl (concave), umbrella (convex), and saddle shapes. Deviations from these shapes result in higher order in-plane distortions. In most cases, these in-plane distortions are slowly spatially varying functions that can be captured by existing alignment models, such as (for example) high order wafer alignment (HOWA) models. Another approach is to use free-form substrate shape measurements. Where the relationship between free-form substrate shape and in-plane distortion after clamping is known or can be modelled, predictions (and corrections) can be made to improve overlay performance.

In situations where stress distribution varies as function of the substrate position or where stressed layers are also deposited on the back-side of the substrate, predicting the in-plane distortion becomes more difficult. By way of a specific example, inhomogeneous stressed thin film layers (e.g., of silicon nitride) may be deposited on both the front and backside of the substrate; these films may be sufficiently similar such that the free-form substrate shape remains flat. In such a case, the in-plane distortion cannot be predicted from a free-form substrate shape measurement. It is also difficult to capture the in-plane distortion using a proper alignment model since the stress distribution may be too high frequency to properly capture and/or have sharp transitions. This may happen when there are both patterned and non-patterned (e.g., edge) fields on the substrate. In addition, the processing fingerprint may conflict with the stress fingerprint due to, for example, alignment mark deformation.

To address this, it is proposed to determine substrate stress by measuring a local shift between two features which are ideally close to each other on the substrate. By way of specific example, the two features may be a capture grating and fine alignment grating of the same alignment mark. The measurements may be made across the substrate to determine a stress fingerprint for the substrate. Such a method is optically analogous to a strain gauge distribution across the substrate.

Figure 4:
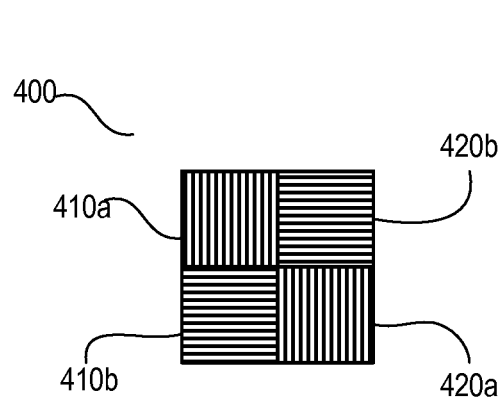
FIG. 4 is a schematic drawing of an exemplary alignment mark which may be measured in embodiments of the invention.

FIG. 4 schematically shows a known type of alignment mark 400. It comprises four segments (gratings): two first gratings 410*a*, 410*b*, each having a first pitch, and two second gratings, each having a second pitch. Gratings 410*a*, 420*a* are orientated for alignment in the Y-direction and gratings 410*b*, 420*b* are orientated for alignment in the X-direction. By having two gratings in each direction of different pitches, the capture range and reliability of the alignment system is increased compared to using only a single grating in each direction. In a specific example, the first gratings 410*a*, 410*b* may have an 16-μm pitch and the second gratings 420*a*, 420*b* may have an 17.6-μm pitch.

The aligned position offset (in each direction), that is the measured position difference, between the measured position of the first grating 410*a*, 410*b* and the measured position of the second grating 420*a*, 420*b* is known as the δ-shift. In an embodiment, measurement of this δ-shift is used to determine stress and in-plane distortion of the substrate. Note that this is only an exemplary alignment mark design suitable for performing stress measurements (and therefore in-plane distortion) in a substrate. In other embodiments, other segmented alignment marks (having two or more segments) may be used to obtain measurement offsets (measured position differences) from measurements of the two segments. Alternatively, other measurement offsets may be used, such as the offset between two different, proximate, alignment gratings. Such alignment gratings may comprise two fine wafer alignment FIWA (e.g., AA5) alignment marks in close proximity (e.g., pairs of marks in closest proximity). Providing that the alignment marks are sufficiently similar and in sufficiently close proximity, the mark asymmetry can be assumed to be the same and therefore to drop out in the δ-shift (offset) measurement. The alignment marks' similarity should be such the marks are not deformed differently by processing (e.g., polishing (CMP)). Where the marks are similar (e.g., identical), the deformation will be the same. Similar in this case may mean having similar or the same critical dimension and/or pitch. However alignment marks with different pitches can also be used for an offset measurement.

The distance between, and properties of, the pairs of features measured for each measurement may be optimized to deliver best signal to noise ratio. This might be achieved, for example by increasing the distance between the grating centers until the best signal to noise ratio is obtained. For the alignment mark such as that illustrated in FIG. 4, this distance is may be in the region of 250 μm.

The two structures should be comprised within the same image when exposed by the scanner. Therefore, in an embodiment, the maximum distance between two alignment marks from which a single offset measurement is made may be the full field image size that can be exposed by the scanner.

It has been observed that the magnitude of the measured δ-shift in substrate areas covered with nitride is within an expected range (about 0.2-0.3 nm). Furthermore, the sign of the δ-shift is in agreement with the applied stress. This shows that in principle it is possible to determine local strain from δ-shift measurements using scanner metrology. From the strain, the local stress can be determined.

Figure 5:
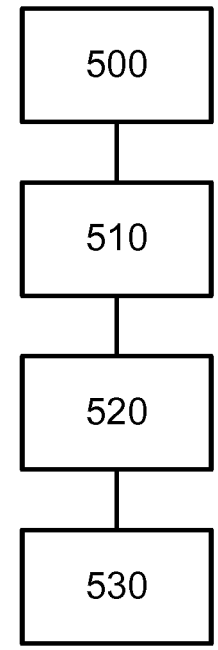
FIG. 5 is a flowchart describing a method according to an embodiment of the invention.

FIG. 5 is a flowchart describing a method according to an embodiment which forms part of a feed forward correction strategy in a lithographic patterning process.

At step 500, the grating-to-grating offset (e.g., δ-shift) is measured between proximate pairs of alignment gratings, as function of the wafer location. The proximate pairs of alignment gratings may comprise pairs of gratings comprised within a single alignment mark. Where the pairs of alignment gratings are comprised within a single alignment mark, it may be that the measured position offset is normally calibrated to be zero. Therefore the actual measured position offset can be used directly. Alternatively, the measured position offset used may be that determined relative to a designed offset between the measured alignment gratings. In this document an alignment mark comprising at least two alignment gratings is referred to as a compound alignment mark. In case of a feature comprising at least two features (each feature being usable for performing a position measurement), such a feature is referred to as a compound feature.

The grating-to-grating offset measurements may be averaged (e.g., per field) to reduce noise. Fields without nitride applied (e.g., edge fields) may be discounted and the method performed only on the fields with nitride applied.

At step 510, the (e.g., averaged) measurements performed at step 500 are used to determine local strain from each pair of measurements; and from these local strain measurements (and known characteristics of the substrate), the stress distribution across the substrate.

At step 520, in-plane distortion of the substrate is calculated from the substrate stress distribution determined at step 510. In this way, the in-plane distortion is derived from actual measurements of local strain.

At step 530, the feed-forward corrections are determined from the determined in-plane distortion. These feed-forward corrections can be used to correct substrate positioning during patterning of subsequent layers on the substrate, thereby improving overlay. During this step, knowledge of layout information may be combined with the measurements to derive complex overlay correction maps. The knowledge of layout information may comprise, for example, which fields (substrate area) will be patterned and which fields (e.g., edge fields) will be non-patterned.

In an embodiment, the measured offset may be corrected for the exposure conditions. Such an embodiment may comprise performing a reference grating-to-grating offset (e.g., reference δ-shift) measurement. Such a calibration may be required as the two alignment mark segments from which a single offset measurement is made may have been exposed with an offset with respect to each other which is different from the designed offset, prior to the processing step (e.g., film deposition and/or annealing). By way of specific example, the image field (layer 1) may be exposed with a magnification offset to match it to the previous layer. In such a case, the measured offset is not equal to the designed offset. When the substrate is then deformed by a processing step (e.g., between layer 1 and a subsequent layer 2), the measured offset will be different to that measured prior to the processing layer.

It is therefore proposed to use the difference between an offset measurement before the processing step and after the processing step as a measure of the strain induced by the processing step. This may comprise performing a first offset measurement (e.g., grating-to-grating offset or δ-shift) before a wafer deformation step (e.g., a film deposition and/or annealing step), a second offset measurement after the wafer deformation step and using the first offset measurement to correct the second offset measurement. For example, the strain measurement may be calculated from the difference of the second offset measurement and first offset measurement.

This reference measurement may be performed on the same substrate as that of the strain measurement offset. As such, each subsequent strain measurement (offset measurement) may be corrected by an offset measurement performed on the same substrate before the wafer deformation step. Alternatively, the reference offset measurement may be made on a reference substrate. The reference substrate may comprise the bare silicon substrate prior to processing by, for example, the addition of the nitride layer(s). The measurements performed on the reference substrate may correspond to those performed on the processed substrate. In either case, the reference offset measurements will yield a systematic (global) grating-to-grating offset which can then be removed from the grating-to-grating offset measurement of the processed substrate in a correction step.

The processed substrate grating-to-grating offset measurements may be combined with layout information (e.g., patterned vs non-patterned fields) to predict local distortion.

Wafer distortion feed-forward models can be built in a manner analogous to (for example) reticle heating models. Instead of using the local temperature as a source of the distortion, the scanner stress measurement can be used.

It should also be appreciated that the concepts described herein are not limited to alignment marks and/or measurements. The concepts can be extended to measurement of positional shifts between (proximate) pairs of other metrology marks/targets, performed by other types of metrology apparatuses, such as the inspection apparatus MET of FIG. 2, which may employ scatterometry techniques, or an electron beam metrology device.

By using the concepts disclosed herein, stress distribution and in-plane distortion can be measured with the scanner (e.g., alignment) metrology. Also, as the measurements are performed on the clamped substrate, the substrate clamping stress contribution is included in addition to the processing contribution (e.g. thin film stress).

Further aspects of the invention are disclosed in the numbered embodiments listed below:

1. A method of determining stress in a substrate, comprising: determining a measured position difference between a measured position of at least one first feature and a measured position of at least one second feature which have been applied on a substrate; and determining local stress in the substrate from said measured position difference.
2. A method according to embodiment 1, wherein said first feature and said second feature each comprise an alignment mark used by a lithographic system in positioning a substrate.
3. A method according to embodiment 2, comprising measuring the measured position of said at least one first feature and the measured position of at least one second feature using an alignment sensor of a lithographic apparatus.
4. A method according to embodiment 3, wherein the measured position of said at least one first feature and the measured position of at least one second feature are measured during alignment of a substrate in a lithographic process prior to performing a patterning step.
5. A method according to embodiment 4, wherein said alignment is performed on the substrate when clamped to a substrate holder such that said stress determination includes a component resultant from the clamping.
6. A method according to any preceding embodiment, wherein said first feature and said second feature each comprise segments of a single compound feature.
7. A method according to any preceding embodiment, wherein said first feature and said second feature are located within a single exposure image field of a lithographic apparatus used to measure said measured positions.
8. A method according to any preceding embodiment, wherein said determining the local stress in the substrate comprises:
determining local strain in the substrate; and
using said determination of local strain and material characteristics of the substrate to determine said local stress in the substrate.
9. A method according to any preceding embodiment, comprising determining a plurality of measured position differences from a plurality of feature pairs, each feature pair being located at a different location on the substrate, and comprising one of said at least one first feature and one of said at least one second feature;
determining a local stress in the substrate from each of the measured position differences; and
determining a stress fingerprint describing stress variation over the substrate, based on the determined local stresses.
10. A method according to embodiment 9, comprising:
averaging measurements from subsets of said plurality of feature pairs to obtain averaged measured position differences; and
using said averaged measured position differences to determine the local stress corresponding to that subset.
11. A method according to embodiment 10, wherein each subset is defined by an image field on the substrate, such that each local stress determination is averaged per image field.
12. A method according to any of embodiments 9 to 11, comprising determining in-plane distortion of said substrate from the stress fingerprint.
13. A method according to embodiment 12, comprising using the determined in-plane distortion to determine corrections for performing a subsequent patterning step on the substrate.
14. A method according to embodiment 13, wherein said step of determining corrections comprises combining the determined in-plane distortion with known layout information of the pattern to be applied to the substrate.
15. A method according to embodiment 14, wherein said known layout information comprises knowledge of the substrate area which is to have a pattern applied
16. A method according to any of embodiments 13 to 15, comprising performing said subsequent patterning step on the substrate using said corrections.
17. A method according to any preceding embodiment, wherein said substrate has been processed by an application of one or more stressed layers.
18. A method according to embodiment 17, wherein local stress determination is performed only areas of the substrate which have been processed by said application of one or more stressed layers.
19. A method according to any preceding embodiment, wherein said measured position difference is determined relative to a designed offset between the first feature and the second feature.
20. A method according to any preceding embodiment, comprising determining an exposure correction for correcting the local stress measurement, by:
determining a reference position difference from a measured position of at least one first feature and a measured position of at least one second feature before a wafer deformation step; determining said measured position difference subsequent to the wafer deformation step; and
correcting said measured position difference using said reference position difference and using the corrected measured position difference in the step of determining local stress.
21. A method according to embodiment 20, wherein said reference position difference is measured on said substrate.
22. A method according to embodiment 20, wherein said reference position difference is measured on a reference substrate which has not been processed by said wafer deformation step.
23. A control system for controlling a lithographic process, the control system comprising:
storage for receiving metrology data comprising a plurality of measured position differences from a plurality of feature pairs, each feature pair being located at a different location on a substrate, and comprising a first feature and a second feature; and
a processor operable to:
determine a local stress in the substrate from each of the measured position differences;
determine a stress fingerprint describing stress variation over the substrate, based on the measured position differences;

determine in-plane distortion of said substrate from the stress fingerprint; and.

determine corrections for performing a subsequent patterning step on the substrate using the determined in-plane distortion.

24. A control system according to embodiment 23, wherein each feature pair comprises an alignment mark used by during the lithographic process when positioning a substrate.

25. A control system according to embodiment 24, operable to measure a measured position of the first feature and a measured position of the second feature of each feature pair, and to determine the measured position differences therefrom.

26. A control system according to embodiment 25, operable to control an alignment operation as part of the lithographic process, and wherein the measured position of said first feature and the measured position of said second feature are measured during said alignment process.

27. A control system according to embodiment 26, being operable to control said alignment when the substrate is clamped to a substrate holder such that said stress determination includes a component resultant from the clamping.

28. A control system according to any of embodiments 23 to 27, wherein the first feature and said second feature of each feature pair, each comprise segments of a single compound feature.

29. A control system according to any of embodiments 23 to 28, wherein the first feature and said second feature of each feature pair are sufficiently proximate on the substrate, such that they are within a single exposure image field of the lithographic process.

30. A control system according to any of embodiments 23 to 29, wherein the processor is operable to:
determine local strain in the substrate; and
use said determination of local strain and material characteristics of the substrate to determine said local stress in the substrate.

31. A control system according to any of embodiments 23 to 30, wherein the processor is operable to:
average measurements from subsets of said plurality of feature pairs to obtain averaged measured position differences; and
use said averaged measured position differences to determine a local stress corresponding to that subset.

32. A control system according to embodiment 31, wherein the processor is operable to define each subset according to an image field on the substrate, such that each local stress determination is averaged per image field.

33. A control system according to any of embodiments 23 to 32, wherein the processor is operable to combine the determined in-plane distortion with known layout information of the pattern to be applied to the substrate when determining the corrections.

34. A control system according to embodiment 33, wherein said known layout information comprises which knowledge of the substrate area which is to have a pattern applied 35. A control system according to any of embodiments 23 to 34, being operable to control said subsequent patterning step on the substrate using said corrections.

36. A control system according to any of embodiments 23 to 35, wherein said substrate has been processed by an application of one or more stressed layers; and said processor is operable to determine said local stress only for areas of the substrate which have been processed by said application of one or more stressed layers.

37. A control system according to any of embodiments 23 to 36, being operable to control a reference determination step by being operable to:
determine a systematic stress fingerprint from measured position differences of reference feature pairs on a reference substrate which has not been processed by the addition of one or more stressed layers; and
use the systematic stress fingerprint to correct said stress fingerprint.

38. A control system according to any of embodiments 23 to 37, wherein the processor is operable to determine said measured position difference relative to a designed offset between the first feature and the second feature of each feature pair.

39. A control system according to any of embodiments 23 to 38, wherein the processor is operable to determine an exposure correction for correcting each local stress measurement, by:
determining a reference position difference from a measured position of at least one first feature and a measured position of at least one second feature before a wafer deformation step;
determining said measured position difference subsequent to the wafer deformation step; and
correcting each measured position difference using said reference position difference and using the corrected measured position difference in the step of determining local stress.

40. A control system according to embodiment 39, operable such that said reference position difference is measured from said substrate.

41. A control system according to embodiment 40, operable such that said reference position difference is measured from a reference substrate which has not been processed by said wafer deformation step.

42. A lithographic apparatus comprising the control system according to any of embodiments 23 to 41.

43. A lithographic apparatus according to embodiment 42 further comprising an alignment measurement system and a patterning system, said alignment measurement system being operable to perform metrology on said substrate to obtain said metrology data, and said patterning system being operable to form device features on said substrate in a patterning process using said determined corrections.

44. A computer program product containing one or more sequences of machine-readable instructions for implementing the steps of a method of any embodiments 1 to 20.

In association with the hardware of the lithographic apparatus and the lithocell LC, an embodiment may include a computer program containing one or more sequences of machine-readable instructions for causing the processors of the lithographic manufacturing system to implement methods of model mapping and control as described above. This computer program may be executed for example in a separate computer system employed for the image calculation/control process. Alternatively, the calculation steps may be wholly or partly performed within a processor a metrology tool, and/or the control unit LACU and/or supervisory control system SCS of FIGS. 1 and 2. There may also be provided a data storage medium (e.g., semiconductor memory, magnetic or optical disk) having such a computer program stored therein in non-transient form.

Although specific reference may have been made above to the use of embodiments of the invention in the context of optical lithography, it will be appreciated that the invention may be used in other patterning applications, for example imprint lithography. In imprint lithography, topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A method of determining stress in a substrate, the method comprising:
    determining a measured position difference between a measured position of at least one first feature and a measured position of at least one second feature which have been applied on a substrate, wherein the first feature and the second feature are located within a single exposure image field of a lithographic apparatus used to measure the measured positions; and
    determining local stress in the substrate from the measured position difference.

2. The method as claimed in claim 1, wherein the at least one first feature and the at least one second feature are comprised within a single alignment mark.

3. The method as claimed in claim 1, wherein the determining the local stress in the substrate comprises:
    determining local strain in the substrate; and
    using the determination of local strain and one or more material characteristics of the substrate to determine the local stress in the substrate.

4. The method as claimed in claim 1, further comprising:
    determining a plurality of measured position differences from a plurality of feature pairs, each feature pair being located at a different location on the substrate, and each feature pair comprising one of the at least one first feature and one of the at least one second feature;
    determining a local stress in the substrate from each of the measured position differences; and
    determining a stress fingerprint describing stress variation over the substrate, based on the determined local stresses.

5. The method as claimed in claim 4, further comprising:
    averaging measurements from subsets of the plurality of feature pairs to obtain averaged measured position differences; and
    using the averaged measured position differences to determine the local stress corresponding to the respective subset.

6. The method as claimed in claim 5, wherein each subset is defined by an image field on the substrate, such that each local stress determination is averaged per image field.

7. The method as claimed in claim 4, further comprising determining in-plane distortion of the substrate from the stress fingerprint.

8. The method as claimed in claim 7, further comprising using the determined in-plane distortion to determine a correction for performing a subsequent patterning step on the substrate.

9. The method as claimed in claim 8, wherein the determining of the correction comprises combining the determined in-plane distortion with known layout information of the pattern to be applied to the substrate.

10. The method as claimed in claim 9, wherein the known layout information comprises knowledge of the substrate area which is to have the pattern applied.

11. The method according to claim 1, wherein the measured position of the at least one first feature and the measured position of the at least one second feature are measured during alignment of a substrate in a lithographic process prior to performing a patterning step.

12. The method according to claim 11, wherein the alignment is performed on the substrate when clamped to a substrate holder such that the stress determination includes a component resultant from the clamping.

13. The method according to claim 1, wherein the at least one first feature and the at least one second feature each comprise segments of a single compound feature.

14. The method according to claim 1, wherein the substrate has been processed by an application of one or more stressed layers.

15. The method according to claim 1, wherein the measured position difference is determined relative to a designed offset between the at least one first feature and the at least one second feature.

16. A control system for controlling a lithographic process, the control system comprising:
    storage for receiving metrology data comprising a plurality of measured position differences from a plurality of feature pairs, each feature pair being located at a different location on a substrate, and each feature pair comprising a first feature and a second feature; and
    a processor configured to at least:
        determine a local stress in the substrate from each of the measured position differences;
        determine a stress fingerprint describing stress variation over the substrate, based on the measured position differences;
        determine in-plane distortion of the substrate from the stress fingerprint; and
        determine, using the determined in-plane distortion, a correction for performing a subsequent patterning step on the substrate.

17. The control system according to claim 16, wherein each feature pair comprises an alignment mark used during the lithographic process when positioning a substrate.

18. The control system according to claim 16, wherein the processor is configured to determine an exposure correction for correcting determined local stress, by:
    determining a reference position difference from a measured position of at least one first feature and a measured position of at least one second feature before a substrate deformation step;
    determining the measured position difference subsequent to the substrate deformation step; and correcting each measured position difference using the reference position difference and using the corrected measured position difference in the step of determining local stress.

19. A lithographic apparatus comprising the control system according to claim 16.

20. A non-transitory computer program product containing one or more sequences of machine-readable instructions therein, the instructions, upon execution by a computer system, configured to cause the computer system to at least:
  determine a measured position difference between a measured position of at least one first feature and a measured position of at least one second feature which have been applied on a substrate, wherein the first feature and the second feature are located within a single exposure image field of a lithographic apparatus used to measure the measured positions; and
  determine local stress in the substrate from the measured position difference.

* * * * *